United States Patent
Ahmed

(10) Patent No.: US 9,966,970 B2
(45) Date of Patent: May 8, 2018

(54) EFFICIENT SILENT CODE ASSIGNMENT TO A SET OF LOGICAL CODES

(71) Applicant: Oracle International Corporation, Redwood City, CA (US)

(72) Inventor: Sadar Ahmed, Santa Clara, CA (US)

(73) Assignee: Oracle International Corporation, Redwood Shores, CA (US)

(*) Notice: Subject to any disclaimer, the term of this patent is extended or adjusted under 35 U.S.C. 154(b) by 120 days.

(21) Appl. No.: 14/682,244

(22) Filed: Apr. 9, 2015

(65) Prior Publication Data

US 2016/0301426 A1 Oct. 13, 2016

(51) Int. Cl.
| | | |
|---|---|---|
| H03M 13/00 | (2006.01) | |
| H03M 7/04 | (2006.01) | |
| H03M 13/05 | (2006.01) | |
| H03M 13/09 | (2006.01) | |

(52) U.S. Cl.
CPC .............. *H03M 7/04* (2013.01); *H03M 13/05* (2013.01); *H03M 13/09* (2013.01)

(58) Field of Classification Search
CPC ...... H03M 9/00; H04L 25/49; H04L 25/4906; G11B 20/1426
See application file for complete search history.

(56) References Cited

U.S. PATENT DOCUMENTS

| | | | |
|---|---|---|---|
| 4,573,034 A * | 2/1986 | Schouhamer Immink | .............. H04L 25/4906 341/106 |
| 6,076,182 A * | 6/2000 | Jeddeloh | ............. G06F 11/1028 714/763 |
| 6,721,918 B2 | 4/2004 | Self et al. | |
| 6,763,406 B1 | 7/2004 | Devanney et al. | |
| 7,519,893 B2 | 4/2009 | Newcomb et al. | |
| 7,764,792 B1 | 7/2010 | Avivi et al. | |
| 8,223,042 B2 | 7/2012 | Abbasfar | |
| 9,484,949 B1 * | 11/2016 | Ahmed | .................. H03M 5/145 |
| 9,606,861 B2 * | 3/2017 | Abali | .................. G06F 11/1004 |
| 2006/0168494 A1 * | 7/2006 | Trainin | ............. H03M 13/2915 714/758 |
| 2007/0217312 A1 | 9/2007 | Newcomb et al. | |

(Continued)

OTHER PUBLICATIONS

Lee, et al. "SILENT: Serialized Low Energy Transition Coding for On-Chip Interconnection Networks," IEEE ICCAD 2004, pp. 448-451.*

*Primary Examiner* — Guy Lamarre
(74) *Attorney, Agent, or Firm* — Meyertons, Hood, Kivlin, Kowert & Goetzel, P.C.

(57) ABSTRACT

A method for determining a mapping between two code spaces is disclosed. The method may include receiving first and second plurality of data words. The least-significant-bits (LSBs) of a first data word of a first subset of the first plurality of data words may be compared to the LSBs of each data word of a second subset of the second plurality of data words. The first data word may then be mapped to a second data word of the second subset. A number of LSBs of the second data word matching LSBs of the first data word may be greater than a respective number of LSBs of each data word of a third subset of the second subset matching the LSBs of the first data word, where the third subset excludes the second data word and a most-significant-bit (MSB) of the second data word may be the same as a MSB of the first data word.

4 Claims, 10 Drawing Sheets

(56) References Cited

U.S. PATENT DOCUMENTS

2008/0180288 A1* 7/2008 Lee .................. H04L 25/49
                                              341/100
2015/0371693 A1* 12/2015 Masleid ............... G11C 8/10
                                              365/230.02

* cited by examiner

EFFICIENT SILENT CODE ASSIGNMENT TO A SET OF LOGICAL CODES

BACKGROUND

Technical Field

Embodiments described herein are related to the field of high-speed interface design, and more particularly to reducing noise resulting from simultaneous switching.

Description of the Related Art

Computing systems typically include a number of interconnected integrated circuits. In some cases, the integrated circuits may communicate through parallel interfaces, which simultaneously communicate multiple bits of data. In other cases, the integrated circuits may employ a serial interface, which sequentially communicates one bit of data at a time. In some cases, both parallel and serial interfaces, individual bits of communicated data may be differentially encoded.

In a computing system, the integrated circuits may have different power supply requirements, which may result in different output voltages being coupled to the integrated circuits' respective communication ports. Furthermore, variations in the properties of wiring traces on circuit boards as well as differences in power supply performance, may further contribute to differences in the power supply voltages supplied to the integrated circuits. Switching of output circuits during the transmission of data from one integrated circuit to another may further contribute to variations in the voltage levels of the power supplies.

Data transmitted between integrated circuit may be encoded to aid in transmission. For serial interfaces, data may be encoded to provide sufficient transitions between logic states to allow for clock and data recovery circuits to operate properly. Data may be encoded to include an even or nearly even number of logical zeros and ones, prior to transmission across parallel interfaces to reduce noise or improve signal integrity.

SUMMARY OF THE EMBODIMENTS

System and methods disclosed herein provide the expression of algorithms that allow the mapping of data words from one code space to another that includes an even or nearly even number of logical zeros and ones. In a non-limiting embodiment, first and second pluralities of data words are received. Each data word of the first plurality of data words includes N data bits, where N is a positive integer, and each data word of the second plurality of data words includes M data bits, where M is a positive integer greater than N. The least-significant-bits (LSBs) of a first data word of a first subset of the first plurality of data words are compared to the LSBs of each data word of a second subset of the second plurality of data words, wherein the LSBs exclude a most-significant-bit (MSB). The first data word is then mapped to a second data word of the second subset. The number of LSBs of the second data word that match the LSBs of the first data word is greater than the number of LSBs of each data word of a third subset of the second subset that match the LSBs of the first data word, where the second data word is excluded from the third subset, and a MSB of the second data word is the same as the MSB of first data word.

In one embodiment, the first subset of the first plurality of data words includes an upper half of the first plurality of data words. The second subset of the second plurality of data words includes an upper half of the second plurality of data words.

In another specific embodiment, the first subset of the first plurality of data words is sort, and the second subset of the second plurality of data words is sorted.

BRIEF DESCRIPTION OF THE DRAWINGS

The following detailed description makes reference to the accompanying drawings, which are now briefly described.

Figure 1:
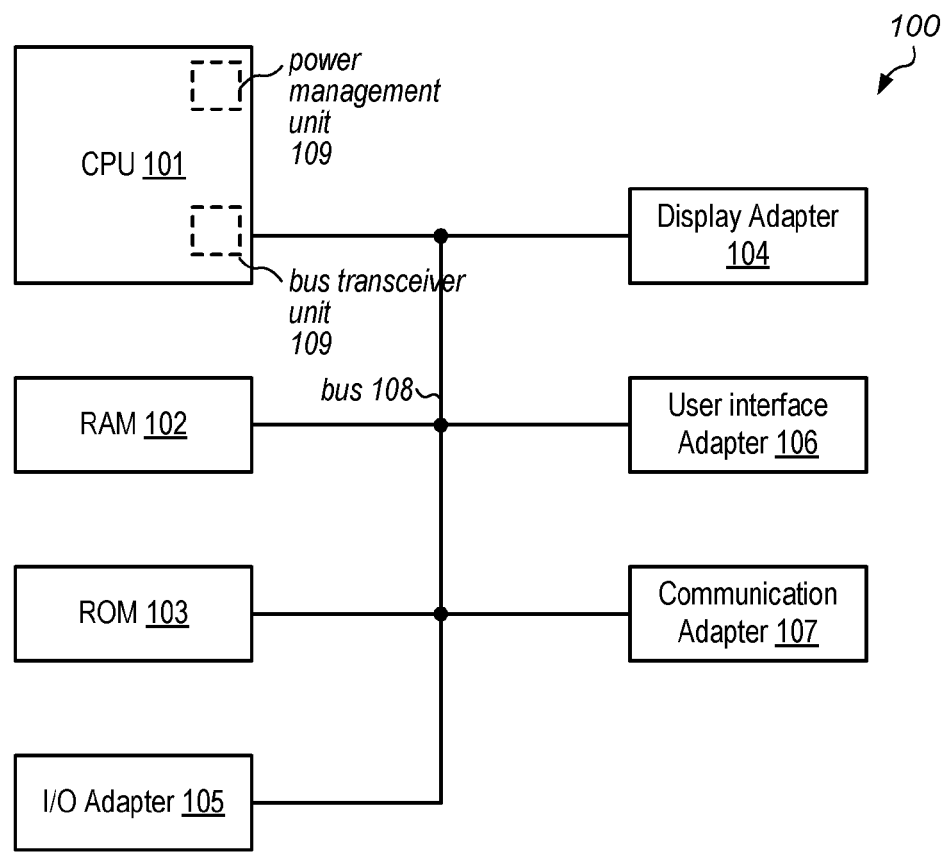
FIG. 1 illustrates an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. The data may be communicated in accordance to one of various communication protocols.

Data communicated between integrated circuits of the computing system may be transmitted over a collection of wires (also referred to herein as a "bus"). In order to change the logic state of a wire on the bus, charge may be applied to the wire, or charge may be removed, i.e., discharged from the wire. In the case of a parallel interface between integrated circuits, multiple wires may be charged or discharged in parallel, commonly referred to as "simultaneous switching."

Simultaneous switching during data transmission may result in higher power consumption within a computing system in addition to power supply and ground noise. In some cases, sub-circuits within the integrated circuits of the computing system may be designed with additional margin to combat reductions in performance resulting from power supply and ground noise. To mitigate the effects of the simultaneous switching of outputs, data may be encoded prior to transmission such that fewer transitions occur from one encoded data word to another.

Changes to environmental and operational parameters, may affect a noise level a computing system may tolerate. As a result, a fixed encoding scheme may be insufficient under certain combinations of environmental and operational parameters, resulting in transmission errors. The embodiments illustrated in the drawings and described herein may provide techniques for determining an encoding/decoding scheme and synthesizing a circuit to implement the encoding/decoding in a computing system, thereby providing a method to transmit data within a given noise tolerance level.

A block diagram of a computing system is illustrated in FIG. 1. In the illustrated embodiment, the computing system 100 includes a CPU 101 coupled to Random Access Memory (RAM) 102, Read-only Memory (ROM) 103, and display adapter 104. CPU 101 is additionally coupled to input/output (I/O) adapter 105, user interface adapter 106, and communications adapter 107. In various embodiments, computing system 100 may be configured as a desktop system, a laptop system, or in any suitable form factor.

RAM 102 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. It is noted that although one RAM is shown, in various embodiments, any suitable number of RAMs may be employed.

CPU 101 may implement any suitable instruction set architecture (ISA), such as, e.g., the SPARC™, PowerPC™, or x86 ISAs, or combination thereof. In some embodiments, CPU 101 may include one or more processor cores configured to implement one of the aforementioned ISAs. CPU 101 may also include one or more cache memories which may be configured to store instructions and/or data during operation. In other embodiments, CPU 101 may include power management unit 110 which may be configured to process and manage requests for changes in the power status of system 100. For example, power management unit 110 may respond to a system request for entry into sleep mode by generating a sleep mode signal that may cause portions of CPU 101, such as bus transceiver unit 109, for example, to power down. In some embodiments, power management unit 110 may coordinate the orderly power up of CPU 101 by generating one or more power up signals each of which may activate a different portion of the circuits within CPU 101.

CPU 101 may include one or more bus transceiver units 109 that allow CPU 101 to connect to bus 108. In some embodiments, bus 108 may be a high-speed serial interface that may conform to an industry standard specification, such as, e.g., PCI Express™, or MIPI Physical Layer. In some embodiments, the various circuits block, such as, e.g., CPU 101, may be coupled to bus 108 through a capacitor (this is commonly referred to as being "AC coupled").

ROM 103 may be configured to store instructions to be executed by CPU 101. In some embodiments, ROM 103 may store instructions necessary for initial boot-up and configuration of CPU 101. The stored instructions may include, in some embodiments, instructions to perform a power-on self-test (POST) that may allow CPU 101 to test embedded cache memories and other circuit blocks that may reside on CPU 101. In some embodiments, ROM 103 may be mask-programmable using a metal, polysilicon, contact, implant, or any suitable mask layer available on a semiconductor manufacturing process.

I/O adapter 105 may be configured to coordinate data transfer between CPU 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O adapter 105 may be configured to implement a version of Universal Serial Bus (USB) protocol or IEEE 1394 (Firewire®) protocol.

Communication adapter 107 may be configured to coordinate data transfer between CPU 101 and one or more devices (e.g., other computer systems) coupled to CPU 101 via a network. In one embodiment, communication adapter 107 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, communication adapter 107 may be configured to implement multiple discrete network interface ports.

User interface adapter 106 may be configured to transfer data between one or more peripheral devices configured to input data into computing system 100. In one embodiment, user interface adapter 106 may receive input from a keyboard and transfer the data to CPU 101. In other embodiments, user interface adapter 106 may receive and format data from a mouse or other suitable pointing device.

Display adapter 104 may be configured to transfer and format data from between CPU 101 and a display screen. In some embodiments, display adapter 104 may be configured to implement a display standard such as Super-VGA or High-Definition Multimedia Interface (HDMI). In other embodiments, display adapter 104 may be configured to implement multiple display interfaces.

The embodiment illustrated in FIG. 1 is merely an example. In other embodiments, different types and numbers of devices are possible and contemplated.

Figure 2:
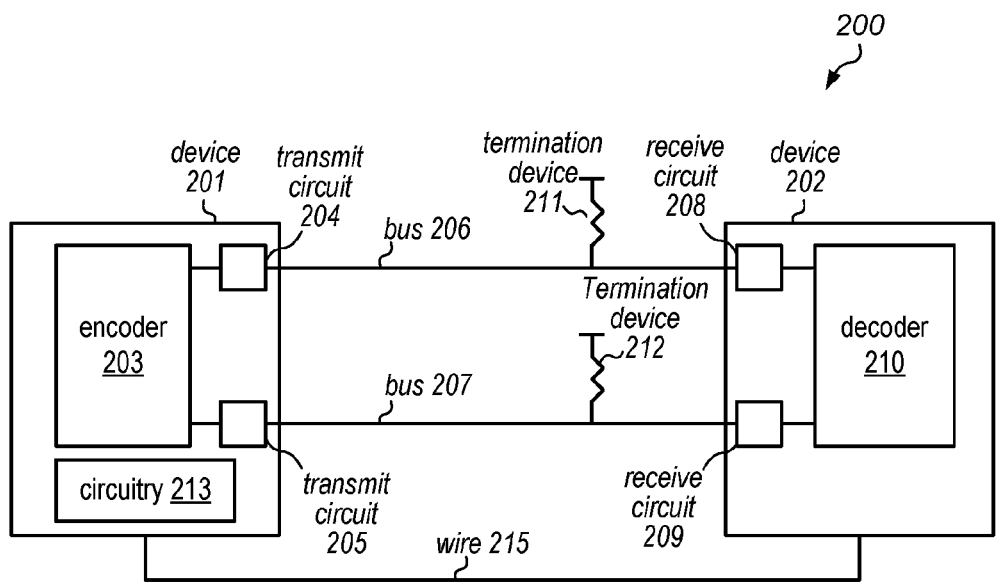
FIG. 2 illustrates another embodiment of a computing system.

Turning to FIG. 2, another embodiment of computing system is illustrated. In the illustrated embodiments, computing system 200 includes device 201 coupled bus 206 and bus 207, which are, in turn, coupled to device 202. Termination devices 211 and 212 are coupled to bus 206 and 207, respectively. In various embodiments, devices 201 and 202 may correspond to any of the functional blocks described above in referenced to computing system 100 as illustrated in FIG. 1.

Bus 206 and bus 207 may, in various embodiments, include multiple conductive traces on a circuit board, substrate, or any other material suitable for the implementation of a computing system, such as computing system 200, for example. In some embodiments, traces at a constant electrical potential may be inserted between the individual traces included in bus 206 and bus 207. Such traces (commonly referred to as "shields") may, in various embodiments, reduce capacitive and inductive coupling between the individual traces of bus 206 and bus 207, thereby improving the integrity of the signals transmitted on busses 206 and 207. Dependent upon a type of data encoding used, a subset of the available multiple conductive traces may be used at a given time. Unused traces may, in some embodiments, may be set to a predetermined voltage level, such as, a ground level, for example. In other embodiments, data may be transmitted such that unused traces are interspersed between active traces, thereby providing a shielding effect.

Device 201 includes encoder 203, which is coupled to transmit circuits 204 and 205, which are, in turn, coupled to bus 206 and bus 207, respectively. In some embodiments, encoder 203 may be configured to encode data to be transmitted to device 202 via bus 206 and bus 207. The data may be encoded by one of various encoding methods such as, e.g., bit inversion, or any other suitable encoding method. Encoder 203 may also generate an error correction code for the data. The error correction code may be generated prior to encoding, or may be generated using the encoded data, and may include a Cyclic Redundancy Check (CRC) or any other suitable error checking code. Encoder 203 may be designed in accordance with one of numerous design styles. For example, encoder 203 may be a general-purpose processor executing program instructions stored in a memory, a dedicated logic circuit, a memory circuit configured to perform as a look-up table, or any other suitable circuit configured to encode data.

Device 201 also includes circuitry 213. In various embodiments, circuitry 213 may receive information via wire 215 indicating a quality level associated with transmission of encoded data on bus 206 and bus 207. Depending on the quality level, circuitry 213 may signal encoder 203 to modify an encoding scheme, or select a different encoding scheme based on a number of available encoding schemes. In various embodiments, circuitry 213 may also generate or store test data that may be encoded by encoder 203 and transmitted to device 202 via busses 206 and 207.

Circuitry 213 may be designed in accordance with one of various design styles. In some embodiments, circuitry 213 may include a dedicated state machine or other sequential logic. Circuitry 213 may, in other embodiments, include a general purpose processor configured to execute program instructions stored in one or more memories included in circuitry 213.

Transmit circuits 204 and 205 may be configured to translate voltage levels of the encoded data for transmission on bus 206 and bus 207, respectively. For example, transmit circuit 204 and 205 may each be configured to transmit data in accordance with the Low-Voltage Transistor-Transistor Logic (LVTTL) standard, or any other suitable voltage levels suitable for signaling from one device to another.

Termination devices 211 and 212 may, in various embodiments, be configured to match the impedance of bus 206 and 207 to the input impedance of receive circuits 208 and 209, respectively. It is noted that although termination devices 211 and 212 are depicted as resistors coupled to a power supply, in other embodiments, termination devices 211 and 212 may include resistors coupled to ground, combinations of resistors, capacitors, and inductors, or any other suitable collection of active or passive circuits elements capable of matching the aforementioned impedances.

Device 202 includes receive circuits 208 and 209 which are coupled to bus 206 and 207, respectively. Receive circuits 208 and 209 are further coupled to decoder 210. Receive circuit 208 and 209 may be configured to translate voltage levels on bus 206 and bus 207, respectively, to a voltage levels used by decoder 210. For example, receive circuits 208 and 209 may translate LVTTL voltage levels to Complementary Metal-Oxide Semiconductor (CMOS) voltage levels.

Decoder 210 may be configured to decode the encoded data received by receive circuits 208 and 209, thereby translating the received encoded data into a format that may be used by device 202. Decoder 210 may also analyze an error checking code such as, e.g., a CRC code, generated by encoder 203, to determine if errors were introduced during the transmission of the data via busses 206 and 207. In some embodiments, decoder 210 may signal to other logic circuits (not shown) within device 202 that the received data contains errors. Decoder 210 may, in other embodiments, attempt to correct the errors in cases where a sending device includes an Error Correction Code (ECC).

In some embodiments, decoder 210 may be designed in accordance with one of numerous design styles. For example, decoder 210 may be a general-purpose processor executing instructions stored in a memory, dedicated logic circuit, a memory device configured to perform as a look-up table, or any other suitable circuit for decoding the received encoded data.

It is noted that the embodiment of a computing system illustrated in FIG. 2 is merely an example. In other embodiments, different numbers of busses coupling different numbers of devices may be employed.

Data sent between integrated circuit may include multiple words (also referred to as "symbols") that include multiple data bits. When such data is transmitted between integrated circuits using a communication bus, such as, e.g., bus 206 as illustrated in FIG. 2, the individual bits included in the symbol may change from a high logic level to a low logic level or vice versa. The transition of multiple data bits from a low logic level to a high logic level may be referred to as Simultaneously Switching Outputs (SSO). It is noted that in some embodiments, a low or low logic level refers to a voltage level at or near ground potential, and a high or high logic levels refers to a voltage sufficiently large to turn on an n-channel Metal-Oxide Semiconductor Field-Effect Transistor (MOSFET) and turn off a p-channel MOSFET. In other embodiments, different technologies may result in different voltage levels for high and low logic levels.

Figure 3:
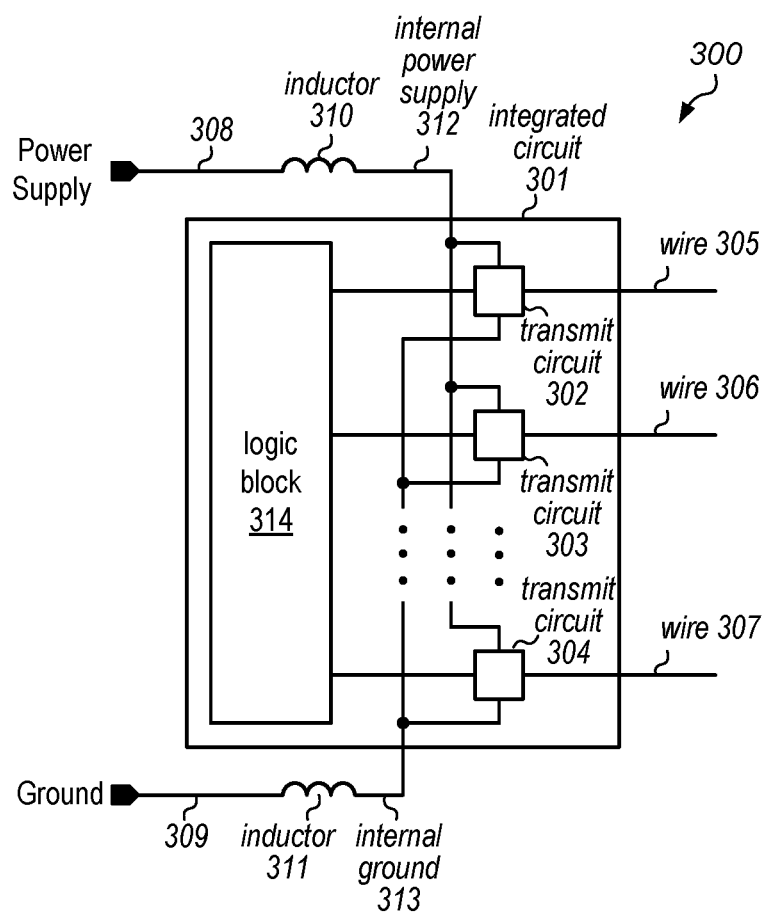
FIG. 3 illustrates an embodiment of an integrated circuit.

An embodiment of integrated circuit power supply system is illustrated in FIG. 3. In the illustrated embodiment, system 300 includes integrated circuit 301, which is coupled to power supply 308 through inductor 310. Integrated circuit 301 is further coupled to ground supply 309 through inductor 311. In various embodiments, inductors 310 and 311 may represent parasitic inductances of integrated circuit packages, power supply traces on a circuit board, and the like. Integrated circuit 301 may, in various embodiments, correspond to device 201 of computing system 200 as illustrated in FIG. 2.

Integrated circuit 301 includes logic block 314 coupled to transmit circuits 302 through 304, which are, in turn, coupled to wires 305 through 307, respectively. In some embodiments, wires 305 through 307 may be part of a communication bus, such as, e.g., bus 206 as depicted in FIG. 2, and transmit circuits 302 through 304 may collectively correspond to one of transmit circuits 204 or 205 of device 201 as illustrated in FIG. 2. Each of transmit circuits 302 through 304 may be configured to translate voltage levels internal to integrated circuit 301 to voltage levels necessary for transmission of the data bits on wires 305 through 307.

Logic block 314 may perform one of various functions. For example, logic block 312 may be a general-purpose processor configured to execute program instructions stored in a memory. In other embodiments, logic block 314 may be a memory or a dedicated state-machine logic circuit. Logic block 314 may, in various embodiments, perform encoding of data to be transmitted off-chip via wires 305 through 307.

During operation, when one of transmit circuits 302 through 304 charges a respective wire of wires 305 through 307 from a low logic level to a high logic level, current is drawn from power supply 308. As the current moves through inductor 310, a voltage may develop across inductor 310, which may result in the voltage level of internal power supply 312 to be less than the voltage level of power supply 308. In some embodiments, the drop on the voltage level of internal power supply 312 may increase when more transmit circuits are required to charge their respective wires to from a low logic level to a high logic level.

A similar result occurs when one of transmit circuits 302 through 304 discharges its respective wire to change the logic level on the wire from a high logic level to a low logic level. The current is steered into ground 309 through inductor 311. As described above, a voltage drop develops across inductor 311 which causes the voltage level of internal ground 313 to rise above the voltage level of ground 309, i.e., ground potential.

Variations in the voltage levels of internal supplies 312 and 313 may, in various embodiments, result in changes in operational or performance parameters of circuits within integrated circuit 301. A lower voltage level on internal power supply 312 may result in circuits within integrated circuit 301 to operate more slowly, which may prevent operation at an intended clock frequency. A higher voltage level on ground 313 may shift the reference level for outgoing signals on wires 305 through 307, which may, in turn, result in the misinterpretation of the logic levels of data bits when they are received at the far-end of wires 305 through 307. In some embodiments, circuits may be designed to provide additional margin in the overall system design in order to compensate for the aforementioned variation in the voltage levels of the internal power supplies. Such circuits may, in various embodiments, have a higher power consumption, be physically larger, and may result in lower manufacturing yield.

It is noted that the embodiment illustrated in FIG. 3 is merely an example. In other embodiments, different numbers of output drivers and different parasitic circuit elements may be possible.

In some embodiments, symbols to be transmitted are encoded, i.e., mapped from their native symbol space, to an alternative symbol space, in order to reduce the number of data bits within a symbol that must transition from a low logic level to a high logic level. When such a mapping is performed, it may, in various embodiments, reduce noise generated by SSO. For example, in various embodiments, a technique referred to as Bit Inversion (BI) may be employed.

Figure 4:
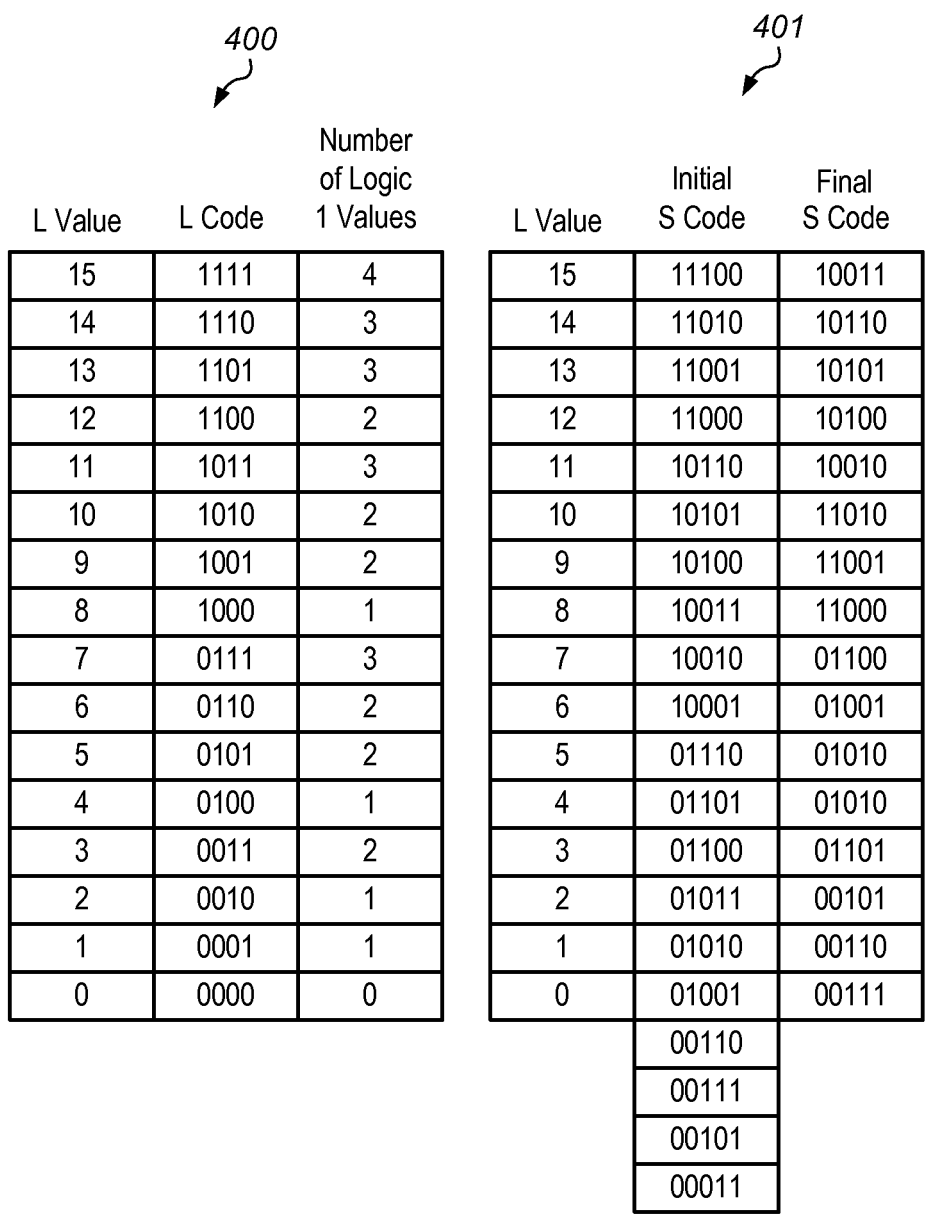
FIG. 4 illustrates a table of logic values and code words of a 4-bit word.

Turning to FIG. 4, two tables are depicted. Table 400 illustrates the possible symbols for using four data bits is illustrated. In the first column of the table, the numeric (or "L value") of a given number is listed, and the in the second column of the table, the equivalent 4 data bit logical symbol (or "L-code") is listed. In the third column of the table, the number of high logic levels (or "logic 1 values") for each corresponding L-code is listed (commonly referred to as the "Hamming weight"). For example, the L-code value of "1111" (L value "1") contains four logic 1 values, while the L-code value of "0001" (L value "1") contains a single logic 1 value.

Table 401 illustrates an embodiment of a nearly even assignment of 5-bit S code values to the possible L code values. Since there are more possible 5-bit S code values than there are possible L code value, but not enough silent codes in the 5-bit S code space, the assignment of L code word to S code word makes use of "quiet" S code words. As described below in more detail, use of quiet codes allows the Hamming weight to vary over a small range during transmission. In table 401, an initial S-code assignment is shown, as well as further optimized final S-code assignment. It is noted that the assignment depicted in table 401 is merely an example. In other embodiments, different choices and optimizations may be result in a different final S-code assignment.

The symbols illustrated in FIG. 4 may be used to transmit numbers, i.e., numbers zero through fifteen, over a four data bit wide bus. As one number is transmitted after another, the change in Hamming weight of the corresponding symbols, determines how many output driver circuits of a integrated circuit, such as, e.g., device 201 as illustrated in FIG. 2, must charge or discharge a wire and corresponding load. For example, if the L-code symbol "0000" was transmitted, following the L-code symbol "1111," all four data bits must transition from a low logic level to a high logic level, thereby creating a high SSO situation. However, in the transition from transmitting L-code symbol "0011" to L-code symbol "1001," there is no SSO noise (also referred to herein as a being "silent") as the number of logic 1 values and the number of logic 0 values remains the same. In other words, the logic 1 values merely rearrange themselves within the 4 data bit wide space. In some embodiments, the use of symbols that contain an equal number of logic 1 values and logic 0 values may result in silent transmission of data from one integrated circuit to another. Symbols that result in little or no SSO generated noise may be referred to as "silent" or "S-code" symbols. While table 400 depicts numbers being represented in a four data bit code, in other embodiments, different number of data bits, allowing different numbers to be represented, may be employed.

Table 401 illustrates a possible nearly even assignment of 5-bit S code values to the possible L code values. In this particular example, the assigned S code words have different Hamming weights. Accordingly, there some SSO noise that will occur as one S code word is transmitted after another. As will be described in more detail below, the assignment of S code values was selected, however, to minimize the change in Hamming weight, thereby providing a reduce SSO implementation.

Figure 5:
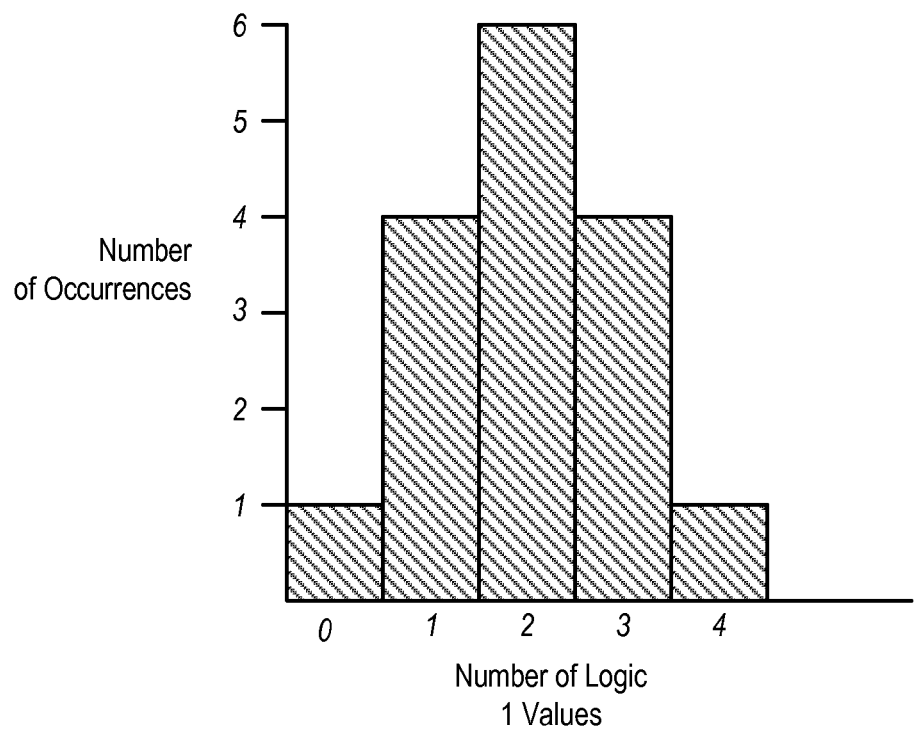
FIG. 5 illustrates a chart depicting a distribution of the number of logic 1 values within a set of logic code words.

The number of logic 1 values within the various code words that span a given data bit width vary. Turning to FIG. 5, a bar graph showing the distribution of the L-code words depicted in table 400 of FIG. 4 is illustrated. In the illustrated graph, the number of L-code words that contain a given number of logic 1 values (ranging from 0 to 4) is depicted. For example, there is exactly one L-code word, namely the L-code word "0000" that has no logic 1 values, and there is exactly one L-code word, namely the L-code word "1111" that has four logic 1 values. The rest of the L-code words contain either one, two, or three logic 1 values.

In the illustrated graph, the code words with two logic 1 values are the most prevalent, followed by code words with one or three logic 1 values. It is noted that the number of occurrences of code words with each given number of logic 1 values form the sequence "1 4 6 4 1." This sequence of numbers may, in various embodiments, correspond with the coefficients of a binomial expansion of order four. In general, for varying data bit widths, the number of code words with a given number of logic 1 values may be determined using the binomial expansion. For example, if code words using 5 data bits were to be transmitted, then, according to the binomial expansion, there would be one code word with no logic 1 values, five code words with one logic 1 value, 10 code words with five logic 1 values, and so forth. As described above, code words with an equal number of logic 1 values and logic 0 values may not generate SSO noise, and that for a given data bit width, code words contain fifty percent (or close to fifty percent) logic 1 values are the most frequently occurring. As described below in more detail, in some embodiments, only code words that have close to fifty percent logic 1 values may be used for transmission.

It is noted that the graph illustrated in FIG. 5 is merely an example. In other embodiments, different data bit widths of code words may result in different numbers of occurrences of code words with a given number of logic 1 values.

Figure 6:
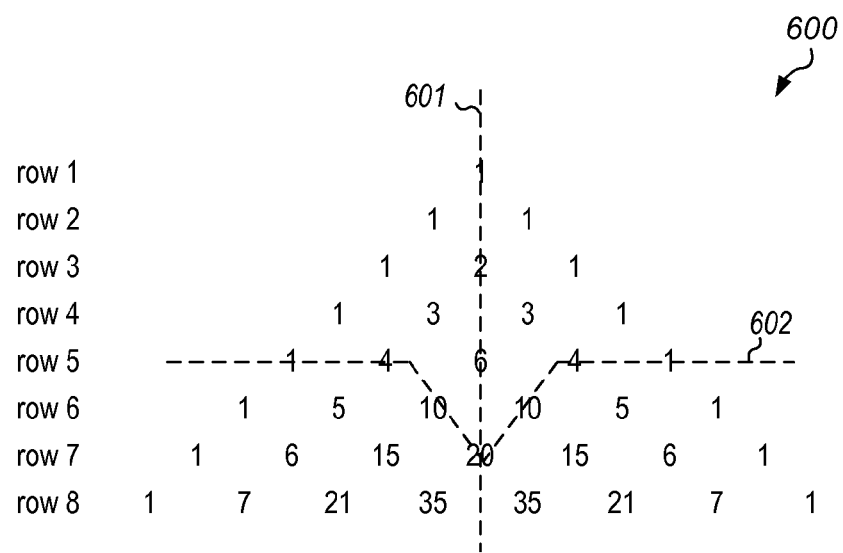
FIG. 6 illustrates an example of Pascal's Triangle.

A particular depiction of the binomial expansion is illustrated in FIG. 6. In the illustrated diagram, coefficients from various binomial expansions are arranged in rows to generate what is commonly referred to as "Pascal's Triangle." Since Pascal's Triangle graphically demonstrates the relationship between the number of symbols within a given number of logic 1 values for different data bit widths, in some embodiments, Pascal's Triangle may be used as a map to translate code words from one code space to another code space that has symbols that generate less SSO.

In the illustrated chart, line 601 indicates code words that have fifty percent logic 1 values. For example, in row 7, Pascal's Triangle indicates that there are 20 symbols that have fifty percent logic 1 values. In embodiments, where only symbols from the aforementioned group of 20 symbols are used in transmission, there may be no SSO generated noise.

Line 602, in the chart illustrated in FIG. 6, depicts an embodiment of how Pascal's Triangle may be employed to translate code words from one code space to another. Row 5 of the Pascal's Triangle depicted in FIG. 6 may correspond to a code space of four bit data words that includes 16 unique symbols. Line 602 indicates that by adding two more bits (which requires two additional wires for transmission between integrated circuits such as device 201 and device 202 as illustrated in FIG. 2) the 16 unique symbols of the four bit data word space may be all mapped onto the 20 silent symbols of a six bit data word space prior to transmission. When the mapped symbols are transmitted, no SSO noise may be generated. In general, any set of L-code symbols may be mapped onto a set of S-code symbols that has a higher cardinality than the set of L-code symbols.

In other embodiments, other mappings may be chosen that do not require, as many additional wires. For example, in the case of the four bit data word space, with one additional wire (which corresponds to row 6 of Pascal's Triangle), the symbols may be mapped into a combination of the 10 symbols that contain 2 logic 1 values and the 10 symbols that contain 3 logic 1 values that are part of the five bit data word code space. Such combinations of symbols may result in "quiet" transmission, i.e., transmission that is not silent, but less noisy than transmission of data that is not encoded.

It is noted that the version of Pascal's Triangle illustrated in FIG. 6 is merely an example. In other embodiments, other code mappings are possible and contemplated.

Figure 7:
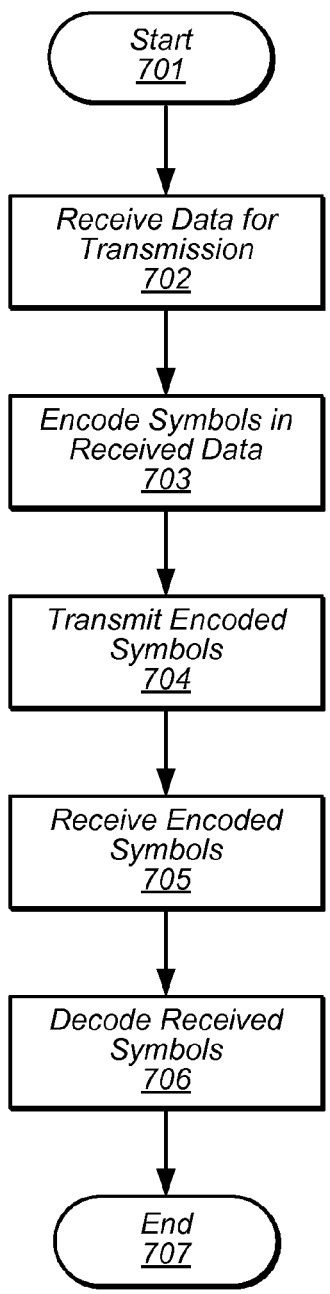
FIG. 7 illustrates a flow diagram for an embodiment of a method of encoding and transmitting data in a computing system.

A flow diagram depicting a method of encoding data to reduce SSO noise is illustrated in FIG. 7. Referring collectively to computing system 200 as illustrated in FIG. 2, and the flowchart of FIG. 7, the method begins in block 701. Within device 201, encoder 203 may then receive data to be transmitted to device 202 (block 702). In some embodiments, the data received by encoder 203 may be from one or more functional blocks (not shown) within device 201. A functional block within device 201 may, in various embodiments, send data to encoder 203 to be transmitted, in response to a request from another device, such as, device 202, for example.

Encoder 203 may then examine each received signal and map, i.e., encode, to a new code space (block 703). In some embodiments, the new code space may be selected dependent upon a desired level of SSO noise. A code space containing silent symbols may, in some embodiments, be selected, while in other embodiments, a code space that requires less additional wires, i.e., a quiet code space, between the two devices may be selected. The data received by encoder 203 may, in various embodiments, be in a binary format, a Binary Coded Decimal (BCD), or any other suitable format. Encoder 203 may, in other embodiments, also encode the mapped word with an Error Correction Code (ECC), Cyclic Redundancy Check (CRC), or any other suitable error check code.

With the encoding of the data complete, encoder 203 may then send the encoded data to transmit circuits 204 and 205, which in turn, transmit the encoded data to device 202, via wires 206 and 207, respectively (block 704). Transmit circuits 204 and 205 may, in various embodiments, convert voltage levels of the encoded data before transmission. In other embodiments, transmit circuits 204 and 205 may adjust a bias level of the encoded data prior to transmission. Transmit circuits 204 and 205 may send data in accordance with one of various industry standard protocols, such as, PCI Express™, for example.

The transmitted data may then be received by receive circuits 208 and 209 of device 202 (block 705). In some embodiments, receive circuits 208 and 209 may convert the voltage levels of the received data to be compatible with an operating voltage level of device 202. Receive circuits 208 and 209 may, in other embodiments, adjust a bias level adjustment to match the data by transmit circuits 204 and 205.

Once the transmitted data has been received by receive circuits 208 and 209, the received data may then be sent to decoder 210, where it is converted back into its original encoding format (block 706). In some embodiments, decoder 210 may also correct any errors resulting from the transmission of the data using an ECC data word that may have been sent along with the encoded data. Decoder 210 may, in various embodiments, employ a general-purpose processor, look-up table (LUT), or any other suitable circuit for the purposes decoding the encoded data. The decoded data may then be sent to one or more functional blocks (not shown) within device 202, at which point the method concludes in block 707. In some embodiments, transmitting data from one device to another using the method depicted in the flowchart of FIG. 7 may result in reduced SSO noise.

It is noted that the method illustrated in FIG. 7 is merely an example. In other embodiments, different operations or different orders of operations are possible.

Figure 8:
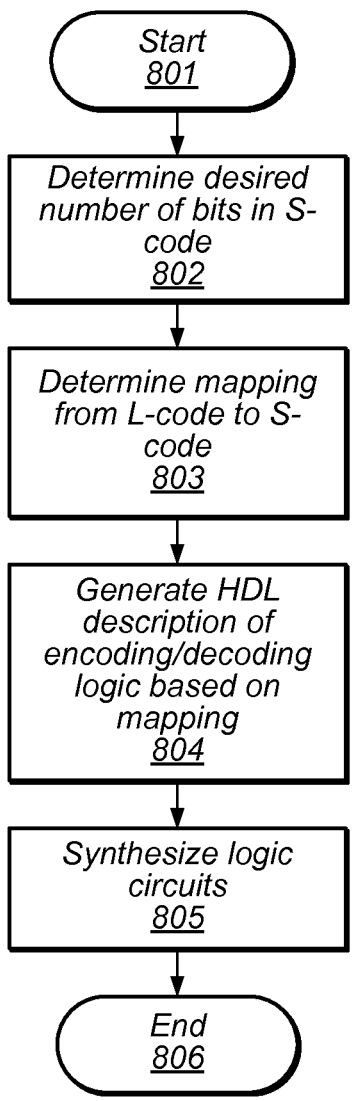
FIG. 8 illustrates a flow diagram for an embodiment of a method for generating synthesizing encoding and decoding circuits.

A flow diagram depicting an embodiment of a method for generating an encoding/decoding circuit is illustrated in FIG. 8. The method begins in block 801. A number of bits for code words in the S-code space is then determined (block 802). In some embodiments, the number of bits for the code words in the S-code space may be determined based on a desired level of switching noise. A number of bits may be chosen to allow a sufficiently large number of code words in the S-code space with a constant Hamming Weight thereby providing a set of codes words which results in no SSO noise. Alternatively, a number of bits may be chose to allow Hamming Weight variation over a small range of values, resulting in a set of "quiet codes."

A mapping from the L-code space to the S-code space is then determined. As described below in more detail, an efficient mapping may be implemented, in some embodiments, using a script or other software tool. Such a mapping may, in various embodiments, allow for synthesis of a logic circuit to encode L-code values to their designated S-Code values, and a logic circuit to decode S-Code values back into their respective L-Code values.

With the mapping from the L-code space to the S-code space determined, Hardware Description Language (HDL) code for the encoding and decoding circuits is then generated (block 804). In some embodiments, the HDL code may be hand-written by a logic design engineer, while, in other embodiments, all or part of the HDL code may be generated using scripts or other software.

Using the HDL code and one of various industry standard Computer Aided Design (CAD) tools, actual logic circuits for the encoding and decoding logic are then created, in a process commonly referred to as "synthesis" (block 805). Such CAD tools may, in various embodiments, select previously designed logic gates (commonly referred to as "standard cells") from a library according to the logic functions described in the HDL code. Additional constraints, such as area, performance, and power consumptions may also be used in the selection of standard cells from the library. With the completion of synthesis, the method concludes in block 806.

It is noted that although the embodiment depicted in FIG. 8 describes the creation of logic circuits based on the determined mapping, in other embodiments, different circuits may be employed. For example, in some embodiments, the determined mapping may be used to determine an algorithm to program a read-only memory (ROM) or other suitable memory that may be employed as a lookup table during encoding and decoding operations.

Figure 9:
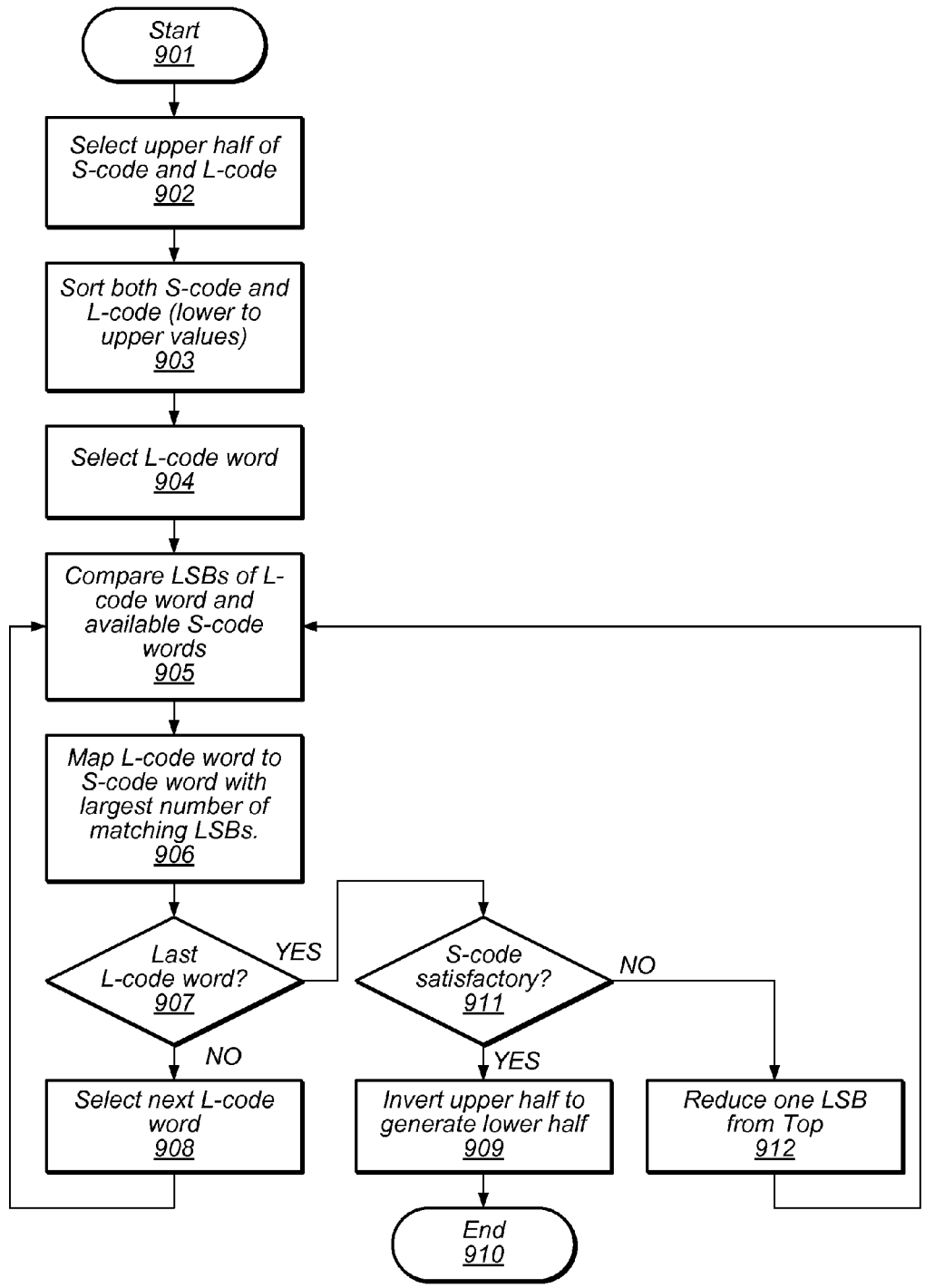
FIG. 9 illustrates a flow diagram for an embodiment of a method for determining a mapping from an L-code space to a S-code space.

A flow diagram depicting an embodiment of a method for determining a mapping between L-code code words and S-code code words is illustrated in FIG. 9.

Although the operations illustrated in FIG. 9 are depicted as being performed in a serial fashion, in other embodiments, one or more of the operations may be performed in parallel. The method illustrated in FIG. 9 may, in various embodiments, correspond to block 803 of the method depicted in FIG. 8. The method begins in block 901.

The upper half of the S-code and L-code space are then selected (block 902). By working on a portion of the respective code spaces, the task of determining a mapping between the two spaces may be simplified. As described below, in regard to block 909, the mapping for the full S-code and L-code spaces may be realized by transforming the values of the upper halves of the two code spaces. The selected upper halves of the two codes spaces may then be sorted from lowest to highest values (block 903), and a first code word from the L-code space may be selected (block 904).

The Least-Significant-Bits (LSBs) of the selected L-code code word are then compared to the LSBs of the available, i.e., not yet mapped, code words in the S-code space (block 905). In various embodiments, each bit position within the selected L-code word may be compared to a corresponding bit position in each available S-code word. For example, values at bit position zero in the two words may be compared. If there is a match, then values at bit position one may be compared, and so on. The results of the LSB comparison of the selected L-code word to each available S-code word may be saved for later use.

The selected L-code word is then mapped to an available S-code word with the largest number of matching LSB values (block 906). In some embodiments, the selection of a matching S-code word may be made from a subset of silent code words in the S-code space. In cases where no silent code words are available, a quiet code word (i.e., a code word that would induce a small amount of SSO noise) may be selected. In cases where a lookup table, such as, e.g., a ROM, implementation is intended for the encoder/decoder circuit, the selection of code words when no silent code words are available may be made to reduce area consumption in the lookup table. The method may then depend on the selected L-code word (block 907).

If additional L-code words remain to be mapped, then the next L-code word from the sorted list may be selected (block 908) and the method may proceed from block 905 as described above. If, however, the selected L-code word is the last L-code word to be mapped, then method may depend upon an examination of the resultant S-code (block 911). In some embodiments, the resultant S-code may be examined in order to ascertain if a desired level of noise reduction has been achieved. Alternatively or additionally, an area or power consumption of a circuit designed to implement the resultant S-code may be examined.

If the S-code meets one or more predetermined conditions, then the lower half of the map is generated by inverting the results for the upper half of the map (block 909). Once the complete map (both upper and lower halves) has been created, the method may conclude in block 910.

If, however, the S-code fails to meet the one or more predetermined conditions, then a number of matching LSBs between the L-code words and the S-code words may be decreased. For example, if a given code word in the currently defined S-code space includes two matching LSBs with a corresponding code word in the L-code space, then matches may be allowed in a subsequent iteration that allow for matching only one LSB between the given code words of the two code spaces. The method may then proceed from block 905 as described above.

It is noted that the method illustrated in FIG. 9 may be performed through the execution of one or more program instructions by a processor. Alternatively or additionally, one or more of the operations may be performed by a dedicated sequential logic circuit or state machine.

Figure 10:
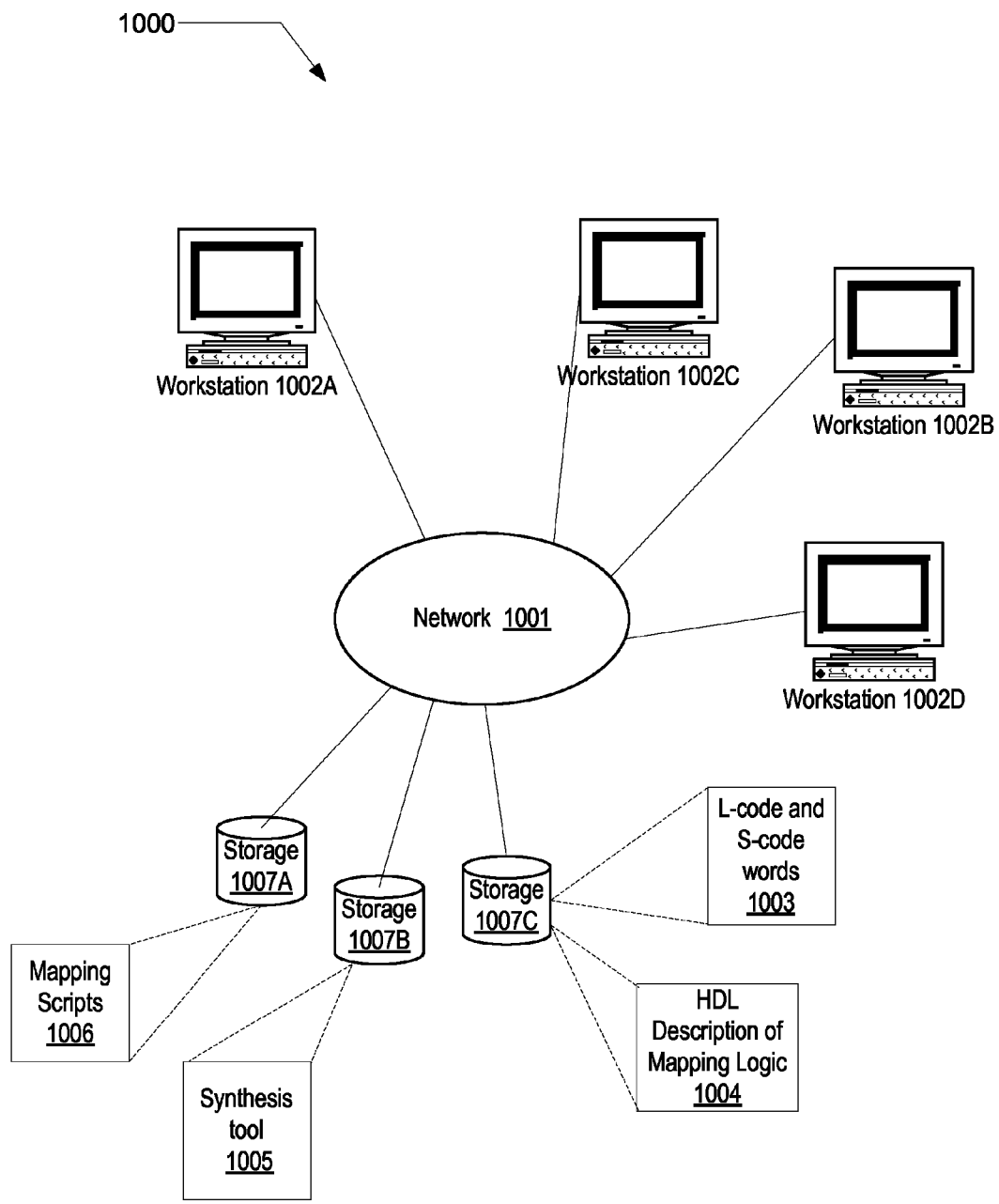
FIG. 10 depicts a block diagram of one embodiment of a computer system including an integrated circuit design tool that implements the embodiment of the method depicted in FIG. 8 and FIG. 9.

Turning to FIG. 10, a block diagram of one embodiment of a computer system including an integrated circuit design tool. The computer system 1000 includes a plurality of workstations designated 1002A through 1002D. The workstations are coupled together through a network 1001 and to a plurality of storage units designated 1007A through 1007C. In one embodiment, each of workstations 1002A through 1002D may be representative of any standalone computing platform that may include, for example, one or more processors, local system memory including any type of random access memory (RAM) device, monitor, input/output (I/O) means such as a network connection, mouse, keyboard, and the like (many of which are now shown for simplicity).

In one embodiment, storage devices 1007A-1007C may be representative of any type of mass storage device such as hard disk systems, optical media drives, tape drives, ram disk storage, and the like. As such, program instructions comprising the design tools such as a circuit simulation tool may be stored within any of storage units 1007A-1007C and loaded into the local system memory of any of the workstations during execution. As an example, as shown in FIG. 10, the mapping scripts 1006, is shown stored within storage unit 1007A, while the L-code and S-code words and the HDL description are stored in storage unit 1007C. Further, a synthesis tool 1005 is stored within storage 1007B. In one embodiment, the synthesis tool 1005 may be called by the either manually with user intervention, or automatically using additional program instructions such as scripting instructions. Additionally, the program instructions may be stored on a portable/removable storage media. The program instructions may be executed directly from the removable media or transferred to the local system memory or mass storage unit 1007 for subsequent execution. As such, the portable storage media, the local system memory, and the mass storages may be referred to as non-transitory computer readable storage mediums. The program instructions may be executed by the one or more processors on a given workstation or they may be executed in a distributed fashion among the workstations, as desired Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:

operating on, by a design tool executing on a computer system, a first plurality of data words, wherein each data word of the first plurality of data words includes N data bits, wherein N is a positive integer greater than one;

operating on, by the design tool executing on the computer system, a second plurality of data words, wherein each data word of the second plurality of data words includes M data bits, wherein M is a positive integer greater than N, wherein a value of M is based upon a predetermined simultaneous switching out (SSO) noise threshold level, and wherein a number of data words in the second plurality of data words is greater than a number of data words in the first plurality of data words;

starting, by the design tool executing on the computer system, at a first bit position of a particular data word of a first subset of the first plurality of data words, generating a comparison of data bits of the particular data word to a first N data bits of each data word of a second subset of the second plurality of data words;

determining, by the design tool executing on the computer system, a respective number of matching data bits between the particular data word and the first N data bits of each data word of the second subset of the second plurality of data words based on results of the comparison;

selecting, by the design tool executing on the computer system, a given data word of the second subset whose bit value at a most-significant-bit (MSB) position is the same as a bit value at a MSB of the particular data word, and that has a largest number of matching data bits with the particular data word;

generating, by the design tool executing on the computer system, a mapping between the particular data word to the given data word;

generating, by the design tool executing on the computer system, a description of the mapping between the particular data word and the given data word using a hardware description language; and synthesizing, by the design tool executing on the computer system, a design of an encoder circuit using the description of the mapping, wherein the encoder circuit is executable to encode a particular data word that includes N data bits to generate an encoded data word that includes M data bits, and transmit, in parallel, the M data bits of the encoded data word.

2. The method of claim 1, wherein the first subset of the first plurality of data words includes an upper half of the first plurality of data words, and wherein the second subset of the second plurality of data words includes an upper half of the second plurality of data words.

3. The method of claim 1, further comprising sorting, by the design tool executing on the computer system, the first subset and the second subset.

4. The method of claim 1, further comprising inverting, by the design tool executing on the computer system, most-significant bits of each data word of a third subset of the second subset, wherein each data word of the third subset is mapped to a given data word of the first subset.

* * * * *